(12) United States Patent
Navaja

(10) Patent No.: US 9,685,396 B2
(45) Date of Patent: Jun. 20, 2017

(54) SEMICONDUCTOR DIE ARRANGEMENT

(71) Applicant: NXP B.V., Eindhoven (NL)

(72) Inventor: Deorex David Avila Navaja, Cabuyao (PH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/865,985

(22) Filed: Sep. 25, 2015

(65) Prior Publication Data

US 2016/0133547 A1 May 12, 2016

(30) Foreign Application Priority Data

Nov. 10, 2014 (EP) ..................................... 14192543

(51) Int. Cl.
*H01L 23/48* (2006.01)
*H01L 23/52* (2006.01)
(Continued)

(52) U.S. Cl.
CPC ...... *H01L 23/4951* (2013.01); *H01L 21/4825* (2013.01); *H01L 21/565* (2013.01);
(Continued)

(58) Field of Classification Search
CPC . H01L 2224/48247; H01L 2224/73265; H01L 2224/32245; H01L 2224/29101; H01L 2224/32145; H01L 2224/92247; H01L 2224/45099; H01L 2224/0603; H01L 2224/48137; H01L 2224/49171; H01L 2924/00; H01L 2924/00014; H01L 2924/00012; H01L 2924/014; H01L 2924/1203; H01L 2924/1301; H01L 2924/13033; H01L 2924/13034; H01L 21/4825; H01L 21/565; H01L 23/3114; H01L 23/4951; H01L 23/49513; H01L 23/4952; H01L 23/49562; H01L 23/49575; H01L 24/06; H01L 24/29; H01L 24/32; H01L 24/48; H01L 24/49; H01L 24/73;
(Continued)

(56) References Cited

U.S. PATENT DOCUMENTS 4,914,045 A * 4/1990 Webb ................ H01L 23/49562
148/DIG. 126
6,055,148 A * 4/2000 Grover .................... H01L 25/16
257/762

(Continued)

FOREIGN PATENT DOCUMENTS

| CN | 203707109 U | 7/2014 |
| DE | 103 03 932 A1 | 3/2004 |
| JP | 6-342818 A | 12/1994 |

OTHER PUBLICATIONS

Extended European Search Report for EP Patent Appln. No. 14192543.8 (May 13, 2015).

*Primary Examiner* — Teresa M Arroyo
(74) *Attorney, Agent, or Firm* — Rajeev Madnawat

(57) ABSTRACT

A semiconductor die arrangement comprising a first die including at least one semiconductor device; a second die including at least one semiconductor device; a lead frame associated with the first die and comprising one or more lead fingers, wherein the second die is mounted on one of the lead fingers and electrically connected to a further element by a bond wire.

14 Claims, 2 Drawing Sheets

(51) Int. Cl.
*H01L 29/40* (2006.01)
*H01L 23/495* (2006.01)
*H01L 23/34* (2006.01)
*H01L 21/00* (2006.01)
*H01L 21/48* (2006.01)
*H01L 21/56* (2006.01)
*H01L 23/31* (2006.01)
*H01L 25/065* (2006.01)
*H01L 23/00* (2006.01)

(52) U.S. Cl.
CPC ...... *H01L 23/3114* (2013.01); *H01L 23/4952* (2013.01); *H01L 23/49513* (2013.01); *H01L 23/49562* (2013.01); *H01L 23/49575* (2013.01); *H01L 24/48* (2013.01); *H01L 25/0657* (2013.01); H01L 24/06 (2013.01); H01L 24/29 (2013.01); H01L 24/32 (2013.01); H01L 24/49 (2013.01); H01L 24/73 (2013.01); H01L 2224/0603 (2013.01); H01L 2224/29101 (2013.01); H01L 2224/32145 (2013.01); H01L 2224/32245 (2013.01); H01L 2224/48137 (2013.01); H01L 2224/48247 (2013.01); H01L 2224/49171 (2013.01); H01L 2224/73265 (2013.01); H01L 2224/92247 (2013.01); H01L 2924/00014 (2013.01); H01L 2924/1203 (2013.01); H01L 2924/1301 (2013.01); H01L 2924/13033 (2013.01); H01L 2924/13034 (2013.01)

(58) Field of Classification Search
CPC ....... H01L 25/0657; B23Q 5/266; B23Q 5/50; G02B 6/3616; G02B 6/3652; G02B 6/4214; G02B 6/4224; G02B 6/4227; G02B 6/423; G02B 6/46

USPC ......... 257/676, 686, 723, 724, 777; 438/123
See application file for complete search history.

(56) References Cited

U.S. PATENT DOCUMENTS

| | | | | |
|---|---|---|---|---|
| 6,184,585 B1* | 2/2001 | Martinez | ........... | H01L 23/49575 257/666 |
| 8,022,522 B1* | 9/2011 | Liou | ................... | H01L 23/3107 257/676 |
| 8,299,588 B1* | 10/2012 | Tateishi | ............ | H01L 23/49562 257/676 |
| 8,471,373 B2* | 6/2013 | Minamio | .............. | H01L 21/565 257/676 |
| 2009/0127685 A1* | 5/2009 | Jong | ................... | H01L 23/4334 257/676 |
| 2011/0100681 A1* | 5/2011 | Kimmich | ........... | H01L 23/3677 174/252 |
| 2011/0169144 A1* | 7/2011 | Moreno | ........... | H01L 23/49562 257/666 |
| 2011/0220916 A1 | 9/2011 | Shimizu et al. | | |
| 2012/0228696 A1* | 9/2012 | Carpenter | ......... | H01L 23/49575 257/329 |
| 2013/0049137 A1* | 2/2013 | Uno | ...................... | H01L 27/088 257/401 |
| 2013/0069210 A1* | 3/2013 | Lee | ..................... | H01L 23/4334 257/666 |
| 2015/0084173 A1* | 3/2015 | Zhang | ............... | H01L 23/49575 257/676 |
| 2015/0173246 A1* | 6/2015 | Jang | ................... | H05K 7/20436 361/715 |
| 2015/0187726 A1* | 7/2015 | Park | .................. | H01L 23/49531 257/666 |
| 2015/0311144 A1* | 10/2015 | Williams | ............ | H01L 23/4952 257/675 |
| 2016/0268241 A1* | 9/2016 | Yamamoto | ........ | H01L 31/02005 |

* cited by examiner

SEMICONDUCTOR DIE ARRANGEMENT

CROSS-REFERENCE TO RELATED APPLICATIONS

This application claims the priority under 35 U.S.C. §119 of European patent application no. 14192543.8, filed on Nov. 10, 2014, the contents of which are incorporated by reference herein.

This disclosure relates to semiconductor die arrangement. In particular, it relates to a semiconductor die arrangement comprising at least two or at least three distinct dies.

An integrated circuit package may include a plurality of dies. Each of the dies may have a semiconductor device(s) formed therein. The dies are typically arranged in a stacked configuration and thus comprise a base die and one or more further dies stacked on top of the base die with the necessary electrical connections formed therebetween. The multiple die stack may then be encapsulated to form a package. In some arrangements a base die has two or more further dies mounted to its surface such that the further dies lie in the same plane. Preventing incorrect electrical connections between the further dies and the base die is important.

According to a first aspect we provide a semiconductor die arrangement comprising
  a first die including at least one semiconductor device;
  a second die including at least one semiconductor device;
  a lead frame associated with the first die and comprising one or more lead fingers,
  wherein the second die is mounted on the or one of the lead fingers and electrically connected to a further element by a bond wire.

Thus, rather than mount the second die on the first die in a stacked configuration it may be advantageous to mount the second die on a lead finger and electrically connect it to a further element.

Optionally, the further element comprises a terminal of the semiconductor device of the first die. Alternatively, the further element comprises a terminal of a further die stacked upon the first die. Thus, a bondwire may be used to connect the lead finger mounted second die to the first die or a further die mounted on the first die. The terminal may comprise an anode, cathode, gate, drain, source, collector, emitter or base terminal depending on the semiconductor device formed in the die. A first side of the first die may be directly or indirectly connected to the leadframe and a second opposed side may receive the connection from the second die or a further die mounted on the second side may receive the connection from the second die.

Optionally, the semiconductor device of the second die comprises a first terminal and a second terminal on opposed sides of the die, the first terminal electrically connected to the lead finger and the second terminal connected to the further element by the bondwire. Thus, the semiconductor device may be formed by a diffusion (n-type/p-type) in the die and thus the terminals may be formed on opposed sides of the die.

Optionally, the arrangement comprises a third die including at least one semiconductor device, the third die mounted on the first die in a stacked configuration and electrically connected to the semiconductor device of the first die. This is advantageous as typically, in a stacked configuration, the second and third dies may be mounted in the same plane on the first die but by mounting the second die on the lead finger, fabrication may be less complex.

Optionally, a terminal of the semiconductor device of the third die is electrically connected to a terminal of the semiconductor device of the first die by conductive die attach material, such as solder or adhesive. Optionally, a terminal of the semiconductor device of the second die is electrically connected to the lead finger by conductive die attach material. Thus, the terminal may be formed on the side which is mounted to the lead finger.

Optionally, the semiconductor device of the first die comprises a triac having a gate terminal and two anode terminals (first and second); and the semiconductor device of the second die comprises a diode having an first terminal and a second terminal, the first terminal electrically connected to the lead finger; and the semiconductor device of the third die comprises a thyristor or silicon-controlled rectifier (SCR) stacked upon and electrically connected to the first of the two anode terminals of the triac; wherein a bondwire electrically connects the gate terminal of the triac to the second terminal of the diode. A second bondwire may be configured to electrically connect a terminal of the thyristor/SCR directly to the lead finger. A third bondwire may be configured to electrically connect the first anode terminal of the triac to a second lead finger. A third lead finger may be electrically connected to the second anode terminal of the triac.

Optionally, the first die includes a first surface which mounts directly or indirectly to the leadframe and a second, opposed surface, the second surface including a first terminal and a second terminal, the first terminal having a smaller area than the second terminal, wherein the second die is electrically connected to the smaller, first terminal of the first die by a bond wire. Thus, the first die may be associated with the leadframe in that it is directly mounted to it. The first die may thus comprises a "base" die. Alternatively, the first die may itself be stacked on a base die or one or more other dies that are mounted on the base die.

Optionally the lead finger comprises a wider portion proximal the first die and a narrower distal portion for providing an external connection to the die arrangement, wherein the second die is mounted to the wider portion. The wider portion may be configured to be encapsulated by an encapsulation material of the arrangement to form a package.

According to a second aspect, we provide a method of fabricating a semiconductor die arrangement comprising;
  receiving a first die including at least one semiconductor device;
  receiving a second die including at least one semiconductor device;
  mounting the first die to a lead frame, the lead frame comprising one or more lead fingers,
  mounting the second die on one of the lead fingers; and
  electrically connecting the semiconductor device of the second die to a further element by a bond wire.

Optionally the first die includes, on the same surface, a first terminal and a second terminal, the first terminal having a smaller area than the second terminal; wherein
  the step of electrically connecting comprises electrically connecting the semiconductor device of the second die to the smaller, first terminal of the first die by a bond wire; and
  the method include the step of mounting a third die on the second, larger area, terminal of the first die in a stacked configuration.

According to a third aspect, we provide an integrated circuit package encapsulating the semiconductor die arrangement as defined in the first aspect.

According to a fourth aspect, we provide an electronic device including the integrated circuit package of the third aspect.

There now follows, by way of example only, a detailed description of example embodiments with reference to the following figures, in which.

Figure 1:
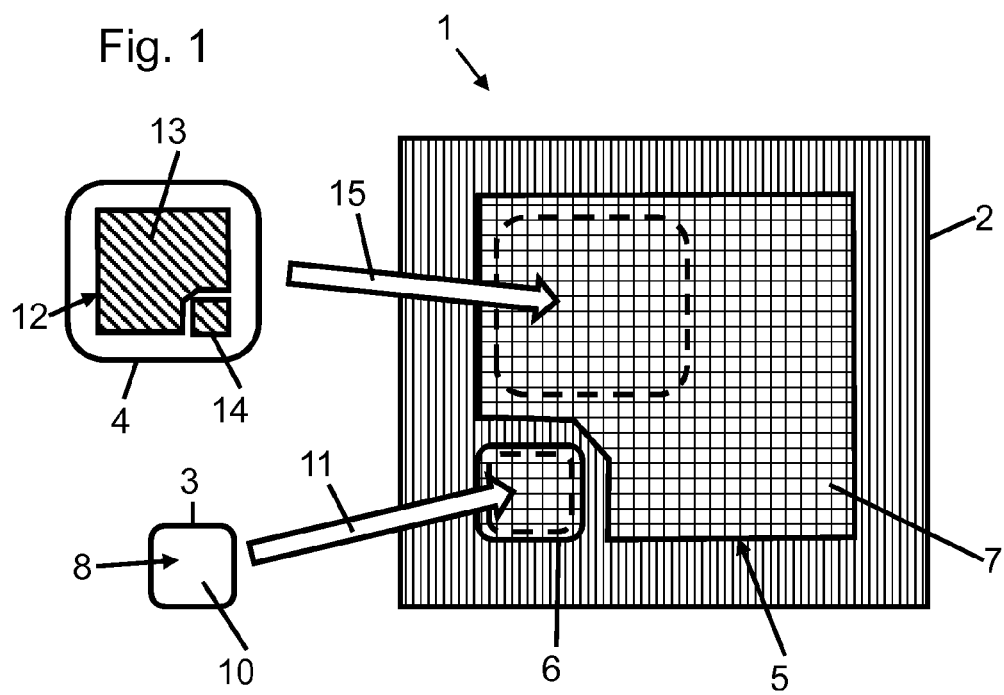
FIG. 1 shows a plan view of a first die and second and third further dies.

FIG. 1 shows a multiple die arrangement 1 comprising a first, base die 2, a second die 3 and a third die 4. In this example the base die 2 includes a semiconductor device comprising a triac 5. An upper surface of the triac includes a gate terminal 6 and a first anode 7.

The second die 3 includes a semiconductor device comprising a diode 8 having an anode terminal on its lower surface (not visible) and a cathode terminal 10 on its upper surface. The second die 3 is configured to be stacked on the base die 2. In particular, the anode terminal of the diode 8 is configured to be stacked on and electrically connected to the gate terminal 6 of the triac 5, as shown by the dashed outline and arrow 11.

The third die 4 includes a semiconductor device comprising a thyristor 12 having a first anode terminal on its lower surface (not visible) and a second anode terminal 13 on its upper surface alongside a gate terminal 14. The third die 4 is configured to be stacked on the base die 2 in the same plane as the second die 3. In particular, the first anode of the thyristor 12 is configured to be stacked on and electrically connected to the first anode 7 of the triac 5, as shown by the dashed outline and arrow 15.

Figure 2:
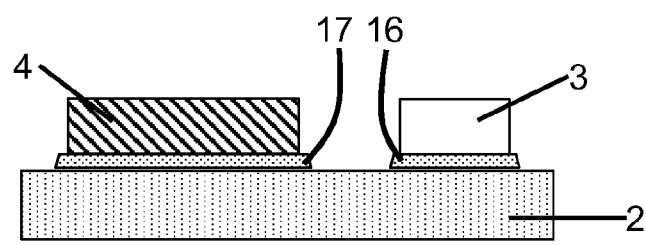
FIG. 2 shows a side view of the first die and second and third further dies.

FIG. 2 shows a side view of the arrangement 1 with the second die 3 of the diode 8 and the third die 4 of the thyristor 12 mounted in a stacked configuration on the base die 2. The second and third dies lie in the same plane. The second die 3 and base die are secured together by a conductive die attach material 16. The die attach material provides the electrical connection between the anode terminal of the diode and the gate terminal 6 of the triac 5. Further, the third die 4 and base die are secured together by a conductive die attach material 17. The die attach material 17 provides the electrical connection between the first anode terminal of the thyristor 12 and the first anode terminal 7 of the triac 5. Incorrect placement or spreading of the die attach material 16, 17 can lead to misplaced connections.

Figure 4:
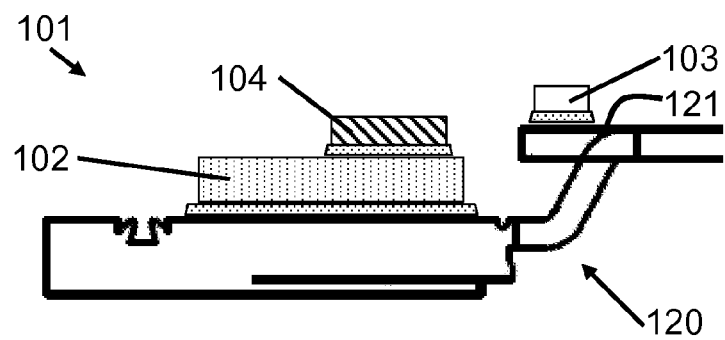
FIG. 4 shows a side view of the arrangement of FIG. 3.
Figure 3:
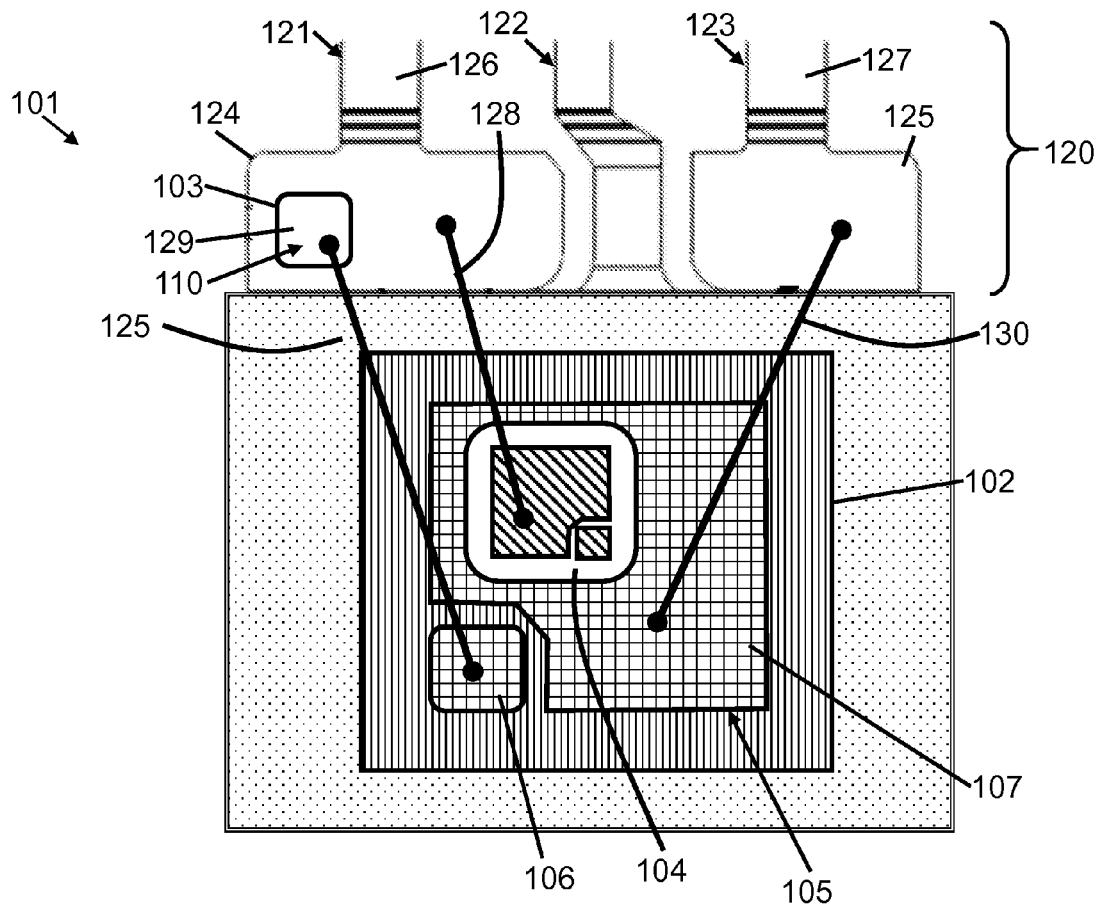
FIG. 3 shows an example semiconductor die arrangement.

FIG. 3 shows an alternative arrangement 101 of the multiple die arrangement. The same reference numerals have been used for like parts but with the addition of "100" to the number used in FIGS. 1 and 2. FIG. 4 shows a side view of the embodiment of FIG. 3. In this arrangement a lead frame 120 is shown mounted to the base die 102. The lead frame includes lead fingers for providing an external electrical connection to the die arrangement 101. In particular, the lead frame includes three lead fingers; a first lead finger 121, a second lead finger 122 and a third lead linger 123. The lead fingers provide for connection of the terminals of the semiconductor devices on the dies 102, 103, 104 to circuitry external to the arrangement 101.

The first and third lead fingers 121 and 123 are substantially T-shaped (although could be L-shaped) and include a wider, head portion 124 and 125 respectively adjacent the base die 101 and a narrower portion 126, 127. The wider portions 124, 125 may be configured to be encapsulated within a package and the narrower portions 126, 127 may extend from the package.

In this arrangement 101, the second die 103 is mounted on the lead finger 121 and, in particular, the wider portion 124 thereof. The second die may be attached by conductive die attach material, such as solder. The wider portion of a lead finger, where it meets the remainder of the leadframe, is an advantageous point to mount a die. A bondwire 125 connects the second die 103 to the gate terminal 106 of the triac 105 of the base die 102. To obtain the same functionality as the arrangement 1 in FIG. 1, the second die 103 is mounted the opposite way up. In particular, the anode terminal 129 of the diode 110 is mounted facing upwards from the lead finger such that an electrical connection can be formed between it and the gate terminal 106. This may be achieved by providing the second die 103 with the reverse N-type and P-type diffusion arrangement compared to that provided in the example of FIG. 1. Thus, where in FIG. 1, the diode had a lower P-type diffusion and an upper N-type diffusion (such that the P-type diffusion formed the anode terminal which contacted the gate terminal 6 of the triac 5), the arrangement 101 has a upper P-type diffusion and a lower N-type diffusion, such that a bondwire can connect the P-type diffusion region to the gate terminal 6.

The third die 104 is stacked on the base die 2 as in the example of FIG. 1 and secured by die attach material or solder for example. A second bondwire 128 electrically connects the second anode terminal 13 of the thyristor 12 of third die 104 to the first lead finger 121. A third bondwire 130 connects the first anode 107 of the triac 105 to the third lead finger 123.

The arrangement 101 may comprise a temperature and overload protected Triac.

The examples herein show a diode as comprising an electronic device, formed in a die, suitable for lead finger mounting. However, other devices may be lead finger mounted. For example, two or more terminal devices wherein two of the terminals are formed on opposite sides of the die are suitable. Alternatively, dies having all terminals on one side may be mounted to the lead finger by their non-terminal side.

Figure 5:
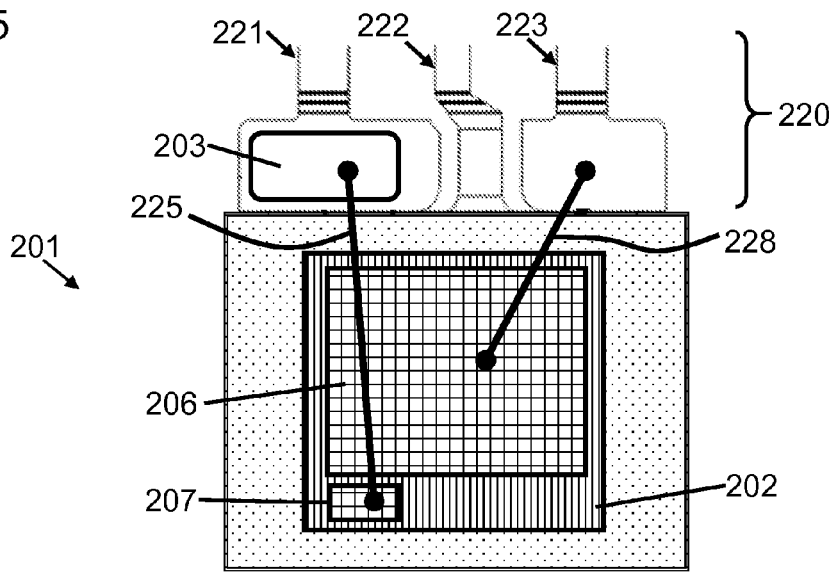
FIG. 5 shows a second example semiconductor die arrangement.

FIG. 5 shows a further example of a die arrangement 201. The arrangement comprises a first die 202 and a second die 203. The first die 202 includes a semiconductor device formed therein having, for example, two terminals on its upper surface; a first terminal 206 and a second terminal 207. The first die 202 is itself stacked upon a base die (not visible) which is mounted to a lead frame 220. The lead frame includes three lead fingers; a first lead finger 221, a second lead finger 222 and a third lead linger 223. The lead fingers provide for connection of the terminals of the semiconductor devices on the dies 202, 203 to circuitry external to the arrangement 201.

The second die 203 is mounted to one of the lead fingers 221 and a bondwire 225 electrically connects the semiconductor device of the second die 203 to one of the terminals 206, 207 of the first die 202. In this example, even though there is only one die (the second die 203) to be mounted in the same plane, the die 203 has been mounted on the lead finger 221. In this example, the second terminal 207 to which the second die is electrically connected, has an area smaller than the second die 203. Thus, it is more convenient to mount the second die to the lead finger 221. It will be appreciated that it may be more convenient to fabricate a second die with an area greater than the terminal on which it is to be mounted and therefore mounting the larger second die on the lead finger makes such an arrangement possible. The skilled man will realise that reasons other than area mismatch may lead to lead finger mounting being preferable, such as isolation between semiconductor devices among others. A further bondwire 228 connects the first terminal 206 of the first die 202 to the third lead finger 223.

The invention claimed is:

1. A semiconductor die arrangement comprising:
   a first die including at least one semiconductor device;
   a second die including at least one semiconductor device; and
   a lead frame receiving the first die and comprising one or more lead fingers,
   wherein the second die is mounted on one of the lead fingers and electrically connected to a plurality of further elements by a plurality of bond wires on the one of the lead fingers,
   wherein a first further element includes a terminal of the semiconductor device of the first die and a second further element includes a terminal of a further die stacked upon the first die,
   wherein the semiconductor device of the first die comprises a triac having a gate terminal and two anode terminals,
   wherein the semiconductor device of the second die comprises a diode having a first terminal and a second terminal, the first terminal electrically connected to the lead finger,
   wherein the semiconductor device of the further die comprises a thyristor or silicon-controlled rectifier (SCR) stacked upon and electrically connected to one of the two anode terminals of the triac, and
   wherein a bondwire electrically connects the gate terminal of the triac to the second terminal of the diode.

2. The semiconductor die arrangement according to claim 1, wherein the semiconductor device of the second die comprises a first terminal and a second terminal on opposed sides of the die, the first terminal electrically connected to the lead finger and the second terminal electrically connected to the second further element by the bondwire.

3. The semiconductor die arrangement according to claim 2, wherein the first terminal of the second die is electrically connected to the lead finger by conductive die attach material.

4. The semiconductor die arrangement according to claim 2, wherein the first terminal includes a cathode of a diode and the second terminal includes an anode of the diode.

5. The semiconductor die arrangement according to claim 2, wherein the further element includes a gate of a triac.

6. The semiconductor die arrangement according to claim 1, wherein the first die includes a first surface which mounts directly or indirectly to the leadframe and a second, opposed surface, the second surface including a first terminal and a second terminal, the first terminal having a smaller area than the second terminal, wherein the second die is electrically connected to the smaller, first terminal of the first die by a bond wire.

7. The semiconductor die arrangement according to claim 1, wherein the lead finger comprises a wider portion adjacent the first die and a narrower portion for providing an external connection, wherein the second die is mounted to the wider portion.

8. The semiconductor die arrangement according to claim 1, wherein the semiconductor die arrangement is encapsulated by an integrated circuit package.

9. The semiconductor die arrangement according to claim 8, wherein the integrated circuit package is included within an electronic device.

10. The semiconductor die arrangement according to claim 1, wherein the plurality of lead fingers having wide portions adjacent the first die and narrow portions configured to provide external connections, and wherein the second die is mounted to one of the wide portions of the lead fingers.

11. A semiconductor die arrangement comprising:
    a first die including at least one semiconductor device;
    a second die including at least one semiconductor device;
    a lead frame receiving the first die and comprising one or more lead fingers,
    wherein the second die is mounted on the or one of the lead fingers and electrically connected to a further element by a bond wire, and
    a third die including at least one semiconductor device, the third die mounted on the first die in a stacked configuration and electrically connected to the semiconductor device of the first die,
    wherein a terminal of the semiconductor device of the third die is electrically connected to a terminal of the semiconductor device of the first die by conductive die attach material,
    wherein the semiconductor device of the first die comprises a triac having a gate terminal and two anode terminals,
    wherein the semiconductor device of the second die comprises a diode having a first terminal and a second terminal, the first terminal electrically connected to the lead finger,
    wherein the semiconductor device of the third die comprises a thyristor or silicon-controlled rectifier (SCR) stacked upon and electrically connected to one of the two anode terminals of the triac, and
    wherein a bondwire electrically connects the gate terminal of the triac to the second terminal of the diode.

12. The semiconductor die arrangement according to claim 11, wherein a terminal of the semiconductor device of the third die is electrically connected by a bond wire to the lead finger.

13. The method of fabricating a semiconductor die arrangement comprising:
    receiving a first die including at least one semiconductor device;
    receiving a second die including at least one semiconductor device;
    mounting the first die to a lead frame, the lead frame comprising one or more lead fingers;
    mounting the second die on one of the lead fingers; and
    electrically connecting the semiconductor device of the second die to a plurality of further elements element by a plurality of bond wires on the one of the lead fingers,
    wherein a first further element includes a terminal of the semiconductor device of the first die and a second further element includes a terminal of a further die stacked upon the first die,
    wherein the semiconductor device of the first die comprises a triac having a gate terminal and two anode terminals,
    wherein the semiconductor device of the second die comprises a diode having a first terminal and a second terminal, the first terminal electrically connected to the lead finger,
    wherein the semiconductor device of the further die comprises a thyristor or silicon-controlled rectifier (SCR) stacked upon and electrically connected to one of the two anode terminals of the triac, and wherein a bondwire electrically connects the gate terminal of the triac to the second terminal of the diode.

14. The method according to claim 13, wherein the first die includes, on the same surface, a first terminal and a second terminal, the first terminal having a smaller area than the second terminal, and wherein the step of electrically connecting comprises electrically connecting the semiconductor device of the second die to the smaller, first terminal of the first die by a bond wire, and further comprising mounting a third die on the second, larger area, terminal of the first die in a stacked configuration.

* * * * *